United States Patent
Yoshida

(10) Patent No.: US 10,096,465 B2
(45) Date of Patent: Oct. 9, 2018

(54) SUBSTRATE PROCESSING METHOD, SUBSTRATE PROCESSING APPARATUS AND RECORDING MEDIUM

(71) Applicant: TOKYO ELECTRON LIMITED, Tokyo (JP)

(72) Inventor: Keisuke Yoshida, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 16 days.

(21) Appl. No.: 15/471,360

(22) Filed: Mar. 28, 2017

(65) Prior Publication Data

US 2017/0294303 A1 Oct. 12, 2017

(30) Foreign Application Priority Data

Apr. 6, 2016 (JP) ................. 2016-076610

(51) Int. Cl.
| | |
|---|---|
| H01L 21/02 | (2006.01) |
| B05C 9/14 | (2006.01) |
| B05C 11/10 | (2006.01) |
| B05D 3/02 | (2006.01) |
| B05D 3/06 | (2006.01) |
| H01L 21/32 | (2006.01) |
| C23C 18/12 | (2006.01) |
| H01L 21/67 | (2006.01) |
| H01L 21/687 | (2006.01) |

(52) U.S. Cl.
CPC .......... *H01L 21/02175* (2013.01); *B05C 9/14* (2013.01); *B05C 11/1002* (2013.01); *B05D 3/0254* (2013.01); *B05D 3/06* (2013.01); *C23C 18/1216* (2013.01); *H01L 21/02178* (2013.01); *H01L 21/02181* (2013.01); *H01L 21/02183* (2013.01); *H01L 21/02186* (2013.01); *H01L 21/02189* (2013.01); *H01L 21/02282* (2013.01); *H01L 21/02345* (2013.01); *H01L 21/02348* (2013.01); *H01L 21/32* (2013.01); *H01L 21/6715* (2013.01); *H01L 21/67115* (2013.01); *H01L 21/67248* (2013.01); *H01L 21/67253* (2013.01); *H01L 21/68742* (2013.01)

(58) Field of Classification Search
CPC .......... H01L 21/0277; H01L 21/28123; H01L 51/0018
See application file for complete search history.

(56) References Cited

U.S. PATENT DOCUMENTS

2005/0014645 A1* 1/2005 Shimbo ............... B41M 5/305
503/201

FOREIGN PATENT DOCUMENTS

| JP | 2014134581 | * | 1/2014 |
| JP | 2014-134581 | A | 7/2014 |

* cited by examiner

*Primary Examiner* — Mohammad Choudhry
(74) *Attorney, Agent, or Firm* — Nath, Goldberg & Meyer; Jerald L. Meyer

(57) ABSTRACT

A substrate processing method includes applying a solution of a compound containing a metal oxide to a surface of a wafer to form a liquid film of the solution on the surface of the wafer, heating the liquid film at a first temperature lower than a crosslinking temperature of the compound, and irradiating the liquid film with energy rays to form a coating film containing the metal oxide on the surface, after heating the liquid film at the first temperature.

7 Claims, 17 Drawing Sheets

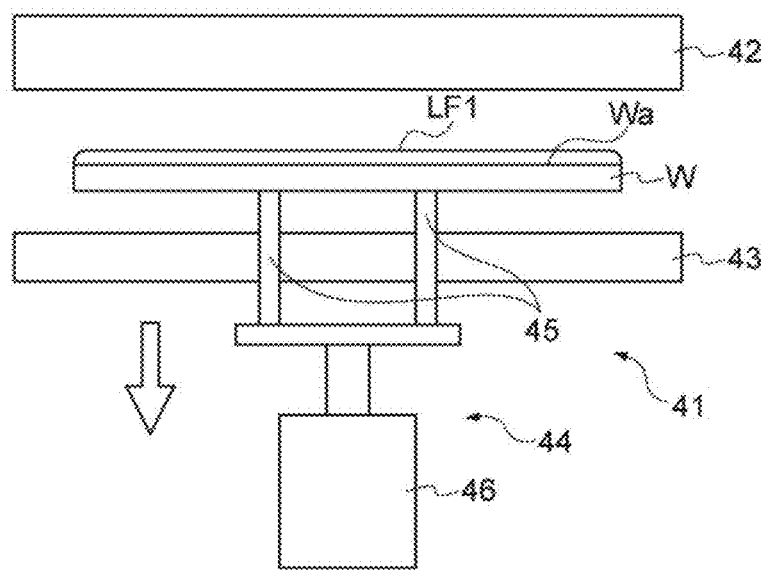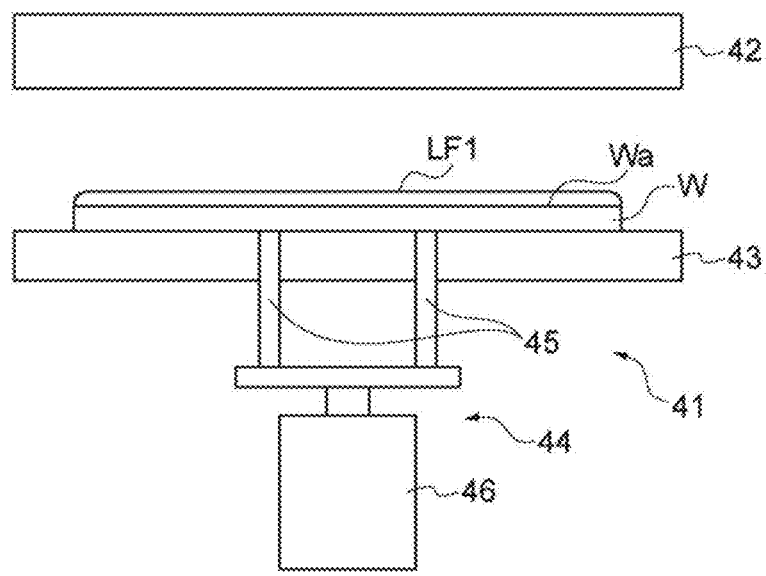

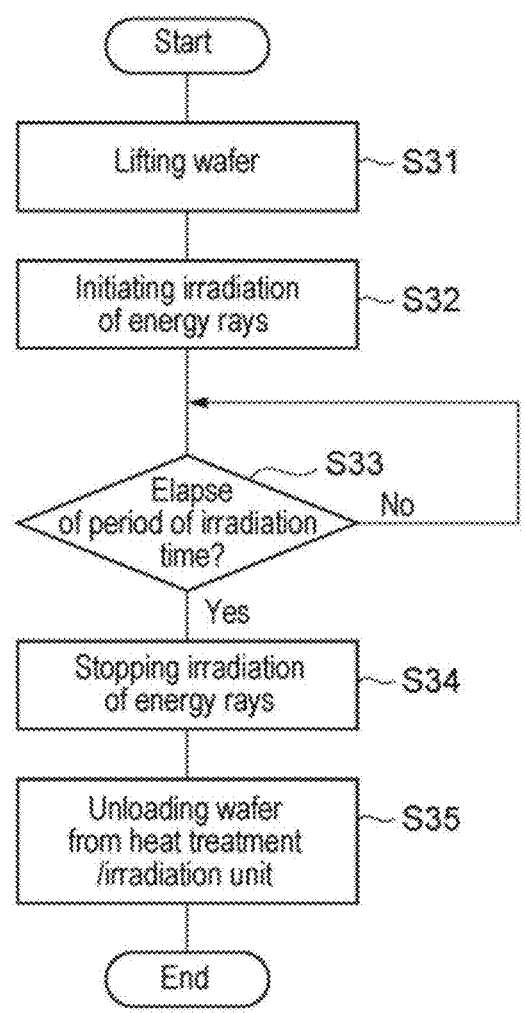

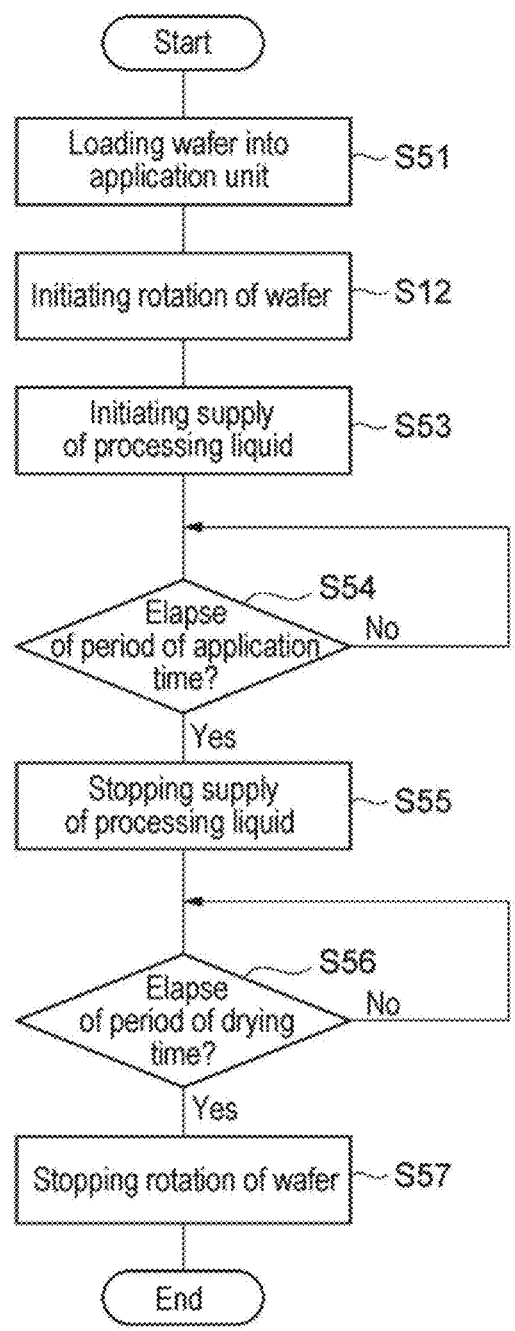

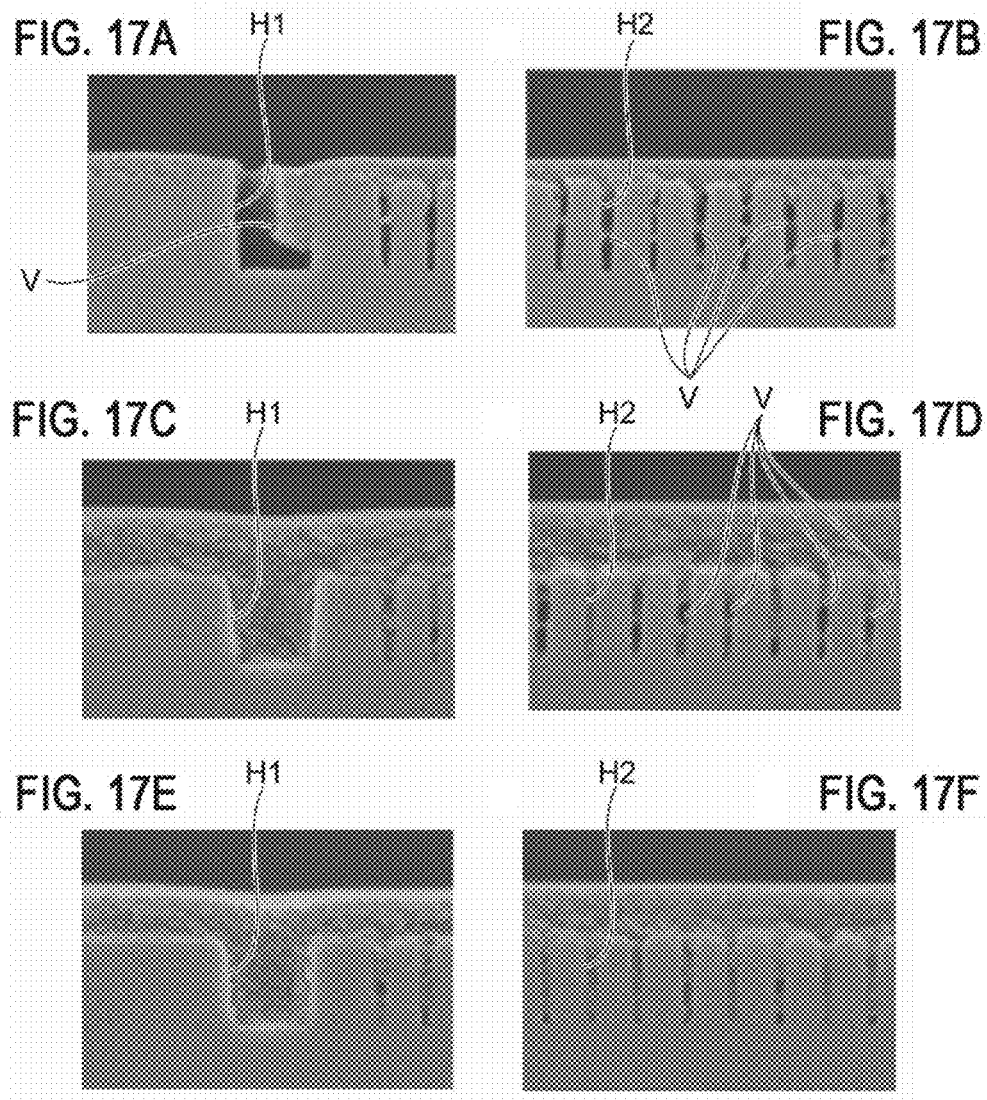

United States Patent US 10,096,465 B2 …

SUBSTRATE PROCESSING METHOD, SUBSTRATE PROCESSING APPARATUS AND RECORDING MEDIUM

CROSS-REFERENCE TO RELATED APPLICATION

This application claims the benefit of Japanese Patent Application No. 2016-076610, filed on Apr. 6, 2016, in the Japan Patent Office, the disclosure of which is incorporated herein in its entirety by reference.

TECHNICAL FIELD

The present disclosure relates to a substrate processing method, a substrate processing apparatus and a non-transitory computer-readable recording medium.

BACKGROUND

In a semiconductor manufacturing process or the like, a coating film containing a metal oxide may be employed. For example, as a method of forming a coating film containing a metal oxide, there has been known a method in which a solution of a compound containing a metal oxide is coated, a solvent is evaporated, and a baking process is performed to promote a crosslinking reaction.

In the method mentioned above, bubbles may be generated when the baking process is performed.

SUMMARY

The present disclosure provides a substrate processing method and a substrate processing apparatus, which may suppress generation of bubbles upon formation of a coating film containing a metal oxide.

According to one embodiment of the present disclosure, there is provided a substrate processing method, including: applying a solution of a compound containing a metal oxide to a surface of a wafer to form a liquid film of the solution on the surface of the water; heating the liquid film at a first temperature lower than a crosslinking temperature of the compound; and irradiating the liquid film with energy rays to form a coating film containing the metal oxide on the surface, after heating the liquid film at the first temperature According to another embodiment of the present disclosure, there is provided a substrate processing apparatus, including: a first processing part configured to apply a solution of a compound containing a metal oxide; a second processing part configured to perform a heat treatment; a third processing part configured to perform an irradiation of energy rays; and a controller, wherein the controller is configured to perform: a control operation for controlling the first processing unit to apply the solution to a surface of a wafer so as to form a liquid film of the solution on the surface of the wafer, a control operation for controlling the second processing part to heat the liquid film at a first temperature lower than a crosslinking temperature of the compound, and a control operation for controlling the third processing part to irradiate the liquid film with the energy rays so as to form a coating film containing the metal oxide on the surface Wa, after heating the liquid film at the first temperature.

According to another embodiment of the present disclosure, there is provided a non-transitory computer-readable medium on which a program for executing the substrate processing method in the substrate processing apparatus is recorded.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 10A and 10B are schematic diagrams showing a state of the wafer in the liquid-film heating procedure.

FIG. 11 is a flowchart showing a coating-film forming procedure.

FIG. 15 is a flowchart showing an underlying liquid-film forming procedure.

FIGS. 17A to 17F are electron microscope photographs of cross sections of the wafer after forming the coating film.

DETAILED DESCRIPTION

Figure 1:
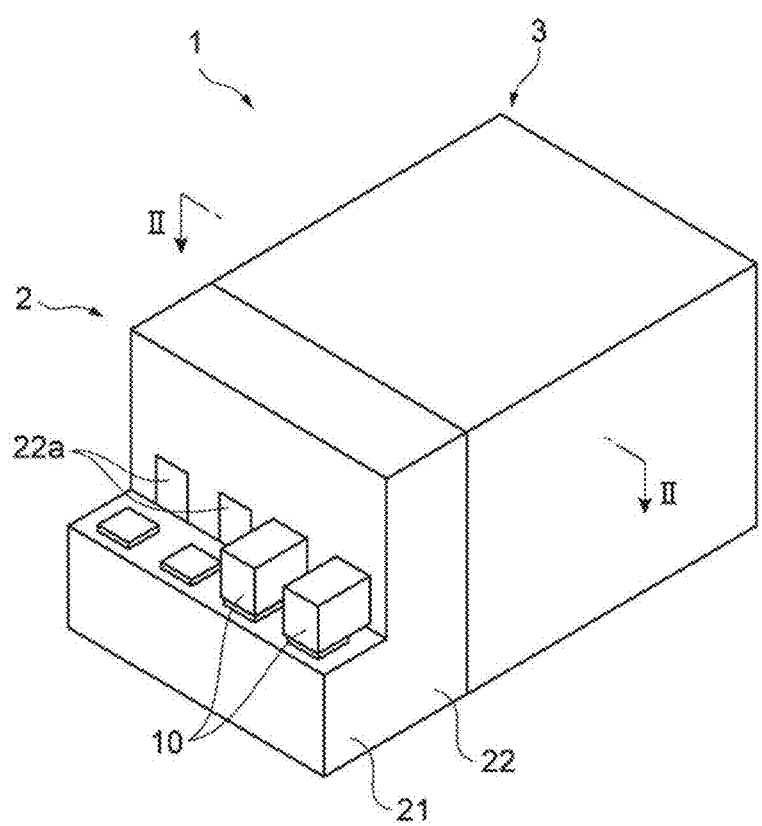
FIG. 1 is a perspective view of a substrate processing system.

Reference will now be made in detail to various embodiments, examples of which are illustrated in the accompanying drawings. In the description, like reference numerals are assigned to same elements or elements having same functions, and repeated descriptions thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Substrate Processing Apparatus>

First of all, as one example of a substrate processing apparatus, a configuration of a substrate processing system 1 will be explained. The substrate processing system 1 forms a coating film containing a metal oxide on a surface of a substrate. Examples of the coating film may include a mask for protecting the surface of the substrate.

Figure 2:
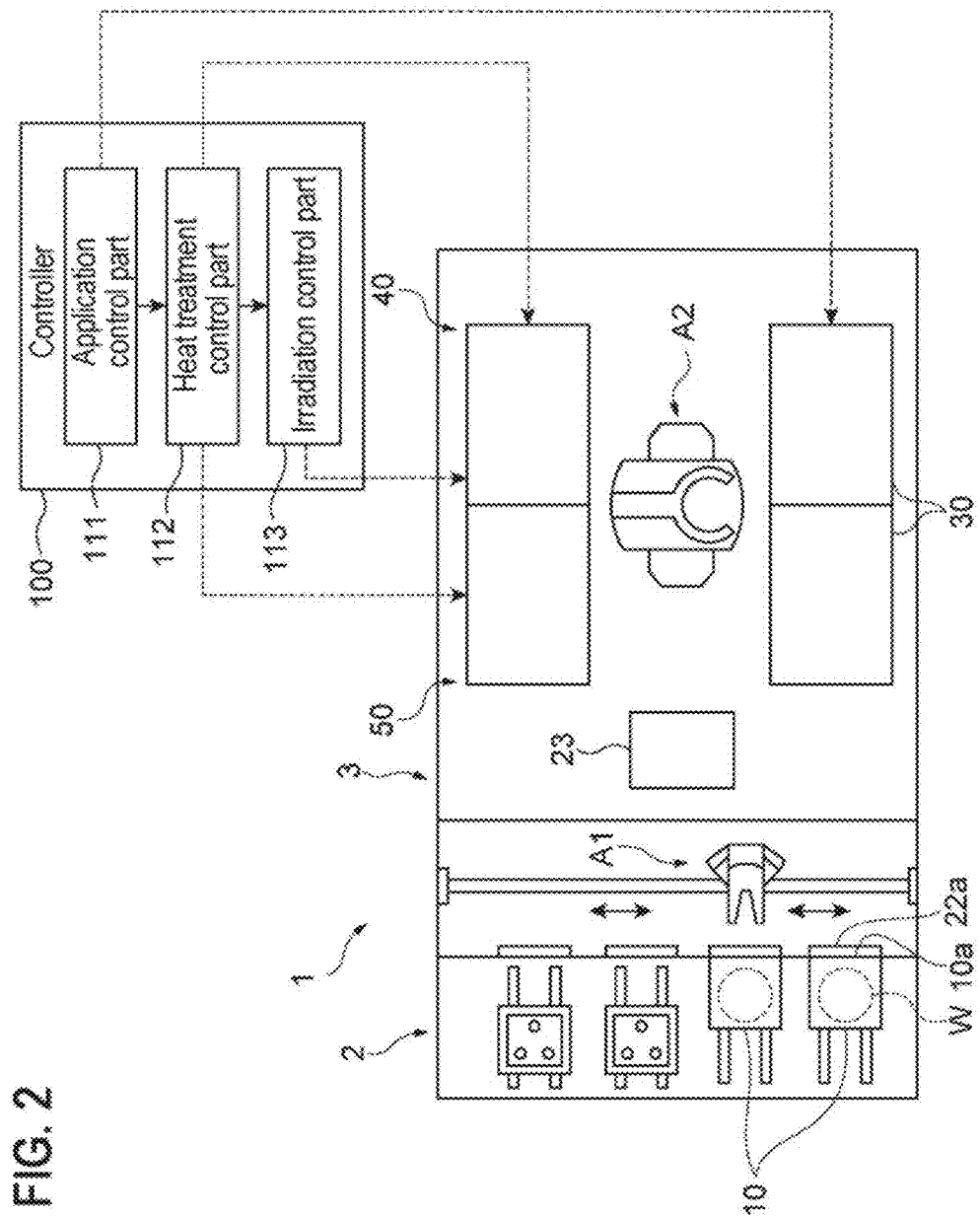
FIG. 2 is a cross-sectional view taken along a line II-II in FIG. 1.

As shown in FIGS. 1 and 2, the substrate processing system 1 includes a carrier block 2 and a processing block 3.

The carrier block 2 includes a carrier station 21 and a loading/unloading part 22. The carrier station 21 supports a plurality of carriers 10. The carriers 10 accommodate a plurality of circular wafers W (for example, semiconductor wafers) as one example of the substrate. An opening/closing door 10a through which the wafer W is loaded or unloaded is provided in one side surface of the carrier 10.

The loading/unloading part 22 is placed to be interposed between the carrier station 21 and the processing block 3, and includes a plurality of opening/closing doors 22a that correspond to the plurality of carriers 10 on the carrier station 21, respectively. The carriers 10 on the carrier station 21 are arranged such that the opening/closing doors 10a face the opening/closing doors 22a, respectively. By simultaneously opening the opening/closing door 22a and the opening/closing door 10a, an interior of the carrier 10 and an interior of the loading/unloading part 22 communicate with each other so that the loading and unloading of the wafer W with respect to the carrier 10 may be performed within the loading/unloading part 22. The loading/unloading part 22 houses a delivery arm A1. The delivery arm A1 takes out the wafer W from the carrier 10 and transfers it to the processing block 3, and then receives the wafer W from the processing block 3 and returns it to the interior of the carrier 10.

The processing block 3 includes a shelf part 23, an application unit 30, a heat treatment/irradiation unit 40, and a transfer arm A2. The shelf part 23 temporarily accommodates the wafer W and is used to deliver the wafer W between the delivery arm A1 and the processing block 3. The shelf part 23 is disposed within the processing block 3 so as to be adjacent to the carrier block 2.

The application unit 30 is a processing part (first processing part) for applying a solution (hereinafter, referred to as "first processing liquid") of a compound (hereinafter, referred to as "first compound") containing a metal oxide to a surface of the wafer W. The first compound is, for example, an organic compound containing a metal oxide. The metal oxide may contain at least one of titanium oxide, zirconium oxide, tantalum oxide, tungsten oxide, hafnium oxide and aluminum oxide.

Specific examples of the first compound may include titanium methoxide, titanium ethoxide, titanium propoxide, titanium butoxide, titanium amyloxide, titanium hexyloxide, methoxy zirconium, ethoxy zirconium, propoxy zirconium, butoxy zirconium, phenoxy zirconium, methoxy tantalum, ethoxy tantalum, propoxy tantalum, butoxy tantalum, phenoxy tantalum, hafnium methoxide, hafnium ethoxide, hafnium propoxide, hafnium butoxide, hafnium amyloxide, hafnium hexyloxide, aluminum methoxide, aluminum ethoxide, aluminum propoxide, aluminum butoxide, aluminum amyloxide, aluminum hexyloxide, and the like.

The first processing liquid may further contain a solvent for dissolving the first compound. The solvent may include, for example, methanol, ethanol, acetone, a thinner and the like.

Figure 3:
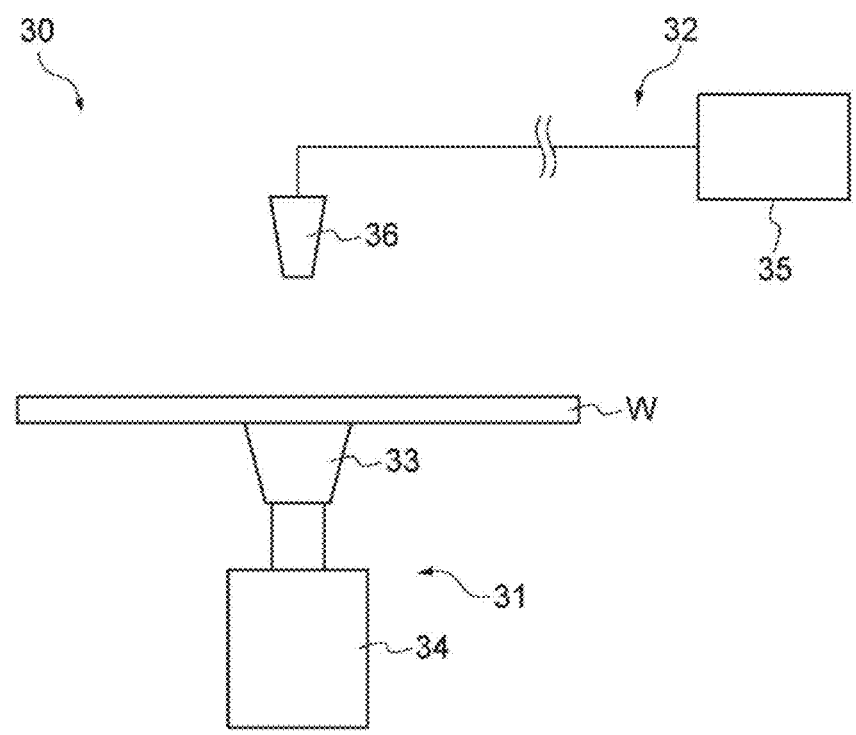
FIG. 3 is a schematic diagram of an application unit.

For example, the application unit 30 includes a rotating/holding mechanism 31 and a processing-liquid supplying part 32 as shown in FIG. 3. The rotating/holding mechanism 31 holds and rotates the wafer W. The rotating/holding mechanism 31 includes a holding part 33 and a driving part 34. The holding part 33 supports the horizontally placed wafer W from below, and holds the wafer W by using vacuum suction or the like. The driving part 34 houses, for example, an electric motor or the like as a power source, and rotates the holding part 33 about a vertical axis.

The processing-liquid supplying part 32 supplies the first processing liquid to a surface Wa of the wafer W. The processing liquid supplying part 32 includes a main body 35 and a nozzle 36. The main body 35 forcibly feeds the first processing liquid, for example, using a pump. The nozzle 36 is disposed above the holding part 33 to downwardly discharge the first processing liquid that has been forcibly fed from the main body 35.

Figure 4:
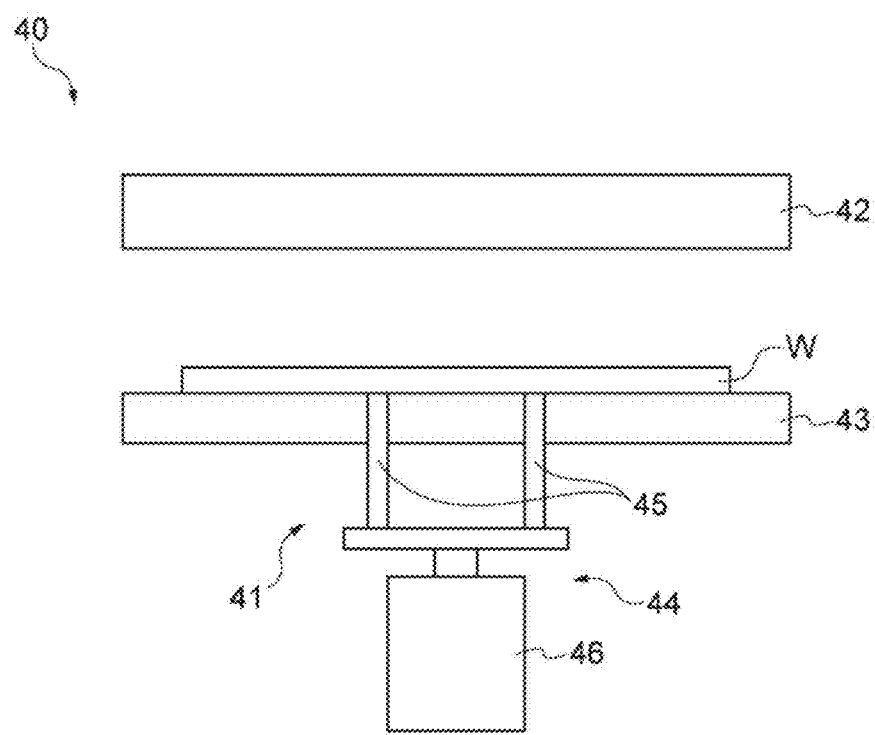
FIG. 4 is a schematic diagram of a heat treatment/irradiation unit.

As shown in FIG. 4, the heat treatment/irradiation unit 40 includes a heat treatment part 41 and an irradiation part 42.

The heat treatment part 41 is a processing part (a second processing part) for performing a heat treatment. For example, the heat treatment part 41 includes a hot plate 43 and a lifting mechanism 44. The hot plate 43 is a plate-shaped heating element for supporting and heating the horizontally placed wafer W. For example, the hot plate 43 houses a plurality of heaters as a heat source. Specific examples of the heater may include an electrically heated wire type heater or the like.

The lifting mechanism 44 raises and lowers the wafer W on the hot plate 43. For example, the lifting mechanism 44 includes a plurality of (for example, three) lifting pins 45 and a driving part 46. The plurality of lifting pins 45 protrudes upwardly to penetrate the hot plate 43. The driving part 46 causes the plurality of elevation pins 45 to be raised and lowered such that tips of the lifting pins protrude above the hot plate 43. It is possible thereby to raise and lower the wafer W on the hot plate 43.

The irradiation part 42 is a processing part (third processing part) for irradiating the energy rays. Any rays having a wavelength in any band may be utilized as the energy rays so far as the irradiation thereof may facilitate crosslinking of the first compound. Specific examples of the energy rays may include ultraviolet rays having a wavelength of 150 to 400 nm. The wavelength of the energy rays may be between 170 and 250 nm.

For example, the irradiation part 42 is installed above the hot plate 43 and includes a light source for emitting ultraviolet rays. Specific examples of the light source may include a krypton fluoride excimer light source for emitting ultraviolet rays having a wavelength of 172 nm, an argon fluoride excimer light source for emitting ultraviolet rays having a wavelength of 193 nm, a krypton chloride excimer light source for emitting ultraviolet rays having a wavelength of 222 nm, or the like. The irradiation part 42 is configured to irradiate the hot plate 43 (placed below the irradiation part) with the energy rays emitted from the light source.

The heat treatment part 41 and the irradiation part 42 may not be necessarily configured as one unit and may be configured as individual parts.

The transfer arm A2 transfers the wafer W between the shelf part 23 and the application unit 30 or the heat treatment/irradiation unit 40 and also transfers the wafer W between the application unit 30 and the heat treatment/irradiation unit 40.

The processing block 3 may further include a heat treatment unit 50. The heat treatment unit 50 is a processing part (a fourth processing part) for performing a heat treatment at a temperature which differs from that in the heat treatment part 41 of the heat treatment/irradiation unit 40. For example, the heat treatment unit 50 may be configured in the same manner as the heat treatment part 41. In the configuration in which the processing block 3 further includes the heat treatment unit 50, the transfer arm A2 also transfers the wafer W between the application unit 30 and the heat treatment unit 50.

A controller 100 is configured to perform a control operation for controlling the application unit 30 to apply the first processing liquid to the surface Wa of the wafer W so that a liquid film of the first processing liquid is formed on the surface Wa, a control operation for controlling the heat treatment part 41 to heat the liquid film at a first temperature lower than a crosslinking temperature of the first compound, and a control operation for controlling the irradiation part 42 to irradiate the liquid film with the energy rays so that a coating film containing a metal oxide is formed on the surface Wa, after heating the liquid film at the first temperature.

The crosslinking temperature is a minimum value of a temperature required for the crosslinking the first compound. The first temperature is lower than the crosslinking temperature of the first compound and may be equal to or lower than a boiling point of the solvent. For example, the first temperature is between 70 and 110 degrees C. and may be between 80 and 100 degrees C. or 85 and 95 degrees C. Heating the liquid film at the first temperature includes heating the liquid film, for example, using a heat source (e.g., the hot plate 43) of which the temperature is maintained around the first temperature.

The controller 100 may be further configured to perform a control operation for controlling the application unit 30 to apply the solution of the first compound (hereinafter, referred to as "second processing liquid") to the surface Wa so that an underlying liquid film having a thickness less than that of the liquid film is formed on the surface Wa, before forming the liquid film on the surface Wa, and a control operation for controlling the heat treatment unit 50 to heat the underlying liquid film at a second temperature higher than the crosslinking temperature of the first compound so that an underlying coating film having a thickness less than that of the coating film is formed on the surface Wa.

For example, the second temperature is between 200 and 300 degrees C. and may be between 230 and 270 degrees C. or 240 and 260 degrees C. Heating the liquid film at the second temperature includes, for example, heating the liquid film using a heat source (e.g., a hot plate) of which the temperature is maintained around the second temperature.

For example, the controller 100 is a functional module and includes an application control part 111, a heat treatment control part 112 and an irradiation control part 113. The application control part 111 controls the application unit 30, the heat treatment control part 112 controls the heat treatment part 41 of the heat treatment/irradiation unit 40 and the heat treatment unit 50, and the irradiation control part 113 controls the irradiation part 42 of the heat treatment/irradiation unit 40. Details of each of the control parts will be described later.

Figure 5:
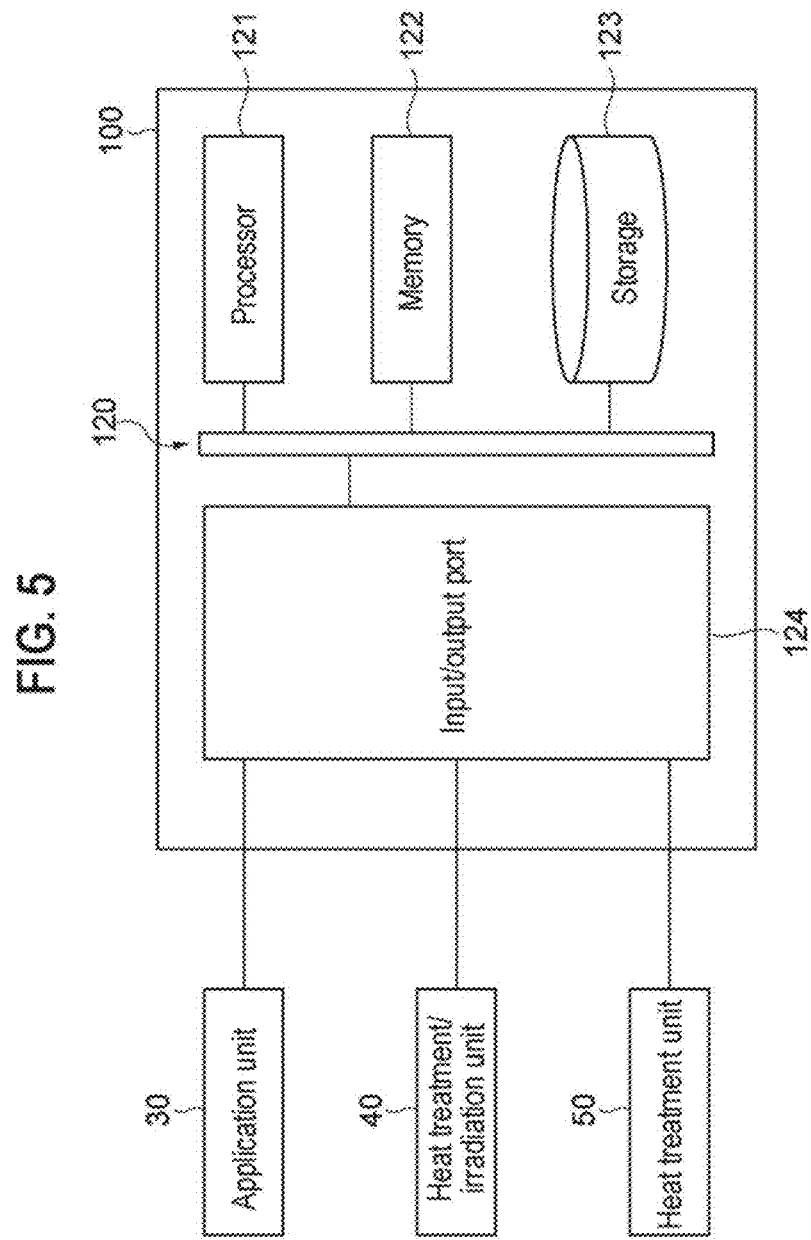
FIG. 5 is a block diagram illustrating a configuration of hardware of a controller.

The controller 100 is comprised of one or a plurality of control computers. For example, the controller 100 includes a circuit 120 shown in FIG. 5. The circuit 120 includes one or a plurality of processors 121, a memory 122, a storage 123, and an input/output port 124. The input/output port 124 performs input and output of electrical signals among the application unit 30, the heat the treatment/irradiation unit 40 and the heat treatment unit 50. For example, the storage 123 includes a computer-readable recording medium such as a hard disk. The recording medium records a program for causing the carrier block 2 and the processing block 3 to execute a substrate processing procedure, which will be described later. The recording medium may be a nonvolatile semiconductor memory and a removable medium such as a magnetic disk, an optical disk or the like. The memory 122 temporarily records the program loaded from the recording medium of the storage 123 and a calculation result obtained by the processor 121. The processor 121 cooperates with the memory 122 to execute the program, constructing each of the aforementioned functional modules.

Further, a hardware configuration of the controller 100 is not necessarily limited to constructing each of the functional modules by using the program. For example, each of the functional modules of the controller 100 may be constructed by using a dedicated logic circuit or ASIC (Application Specific Integrated Circuit) in which the dedicated logic circuit is integrated.

<Substrate Processing Method>

Subsequently, as one example of a substrate processing method, a substrate processing procedure performed by the controller 100 controlling the carrier block 2 and the processing block 3 will be described. This substrate processing procedure includes applying the first processing liquid to the surface Wa to form the liquid film on the surface Wa of the wafer W, heating the liquid film at the first temperature, and irradiating the liquid film with the energy rays to form the coating film containing the metal oxide on the surface Wa, after heating the liquid film at the first temperature.

Figure 6:
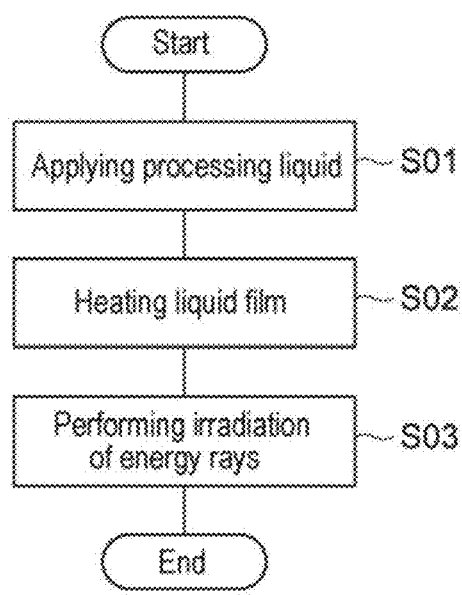
FIG. 6 is a flowchart showing a substrate processing procedure.

As shown in FIG. 6, the substrate processing procedure sequentially includes steps S01 to S03. In step S01, the controller 100 controls the application unit 30 to apply the first processing liquid to the surface Wa so that the liquid film is formed on the surface Wa. In step S02, the controller 100 controls the heat treatment unit 41 to heat the liquid film at the first temperature. In step S03, the controller 100 controls the irradiation part 42 to irradiate the liquid film with the energy rays so that the coating film containing the metal oxide is formed on the surface Wa. Hereinafter, the processing in steps S01 to S03 will be described in greater detail.

Figure 7:
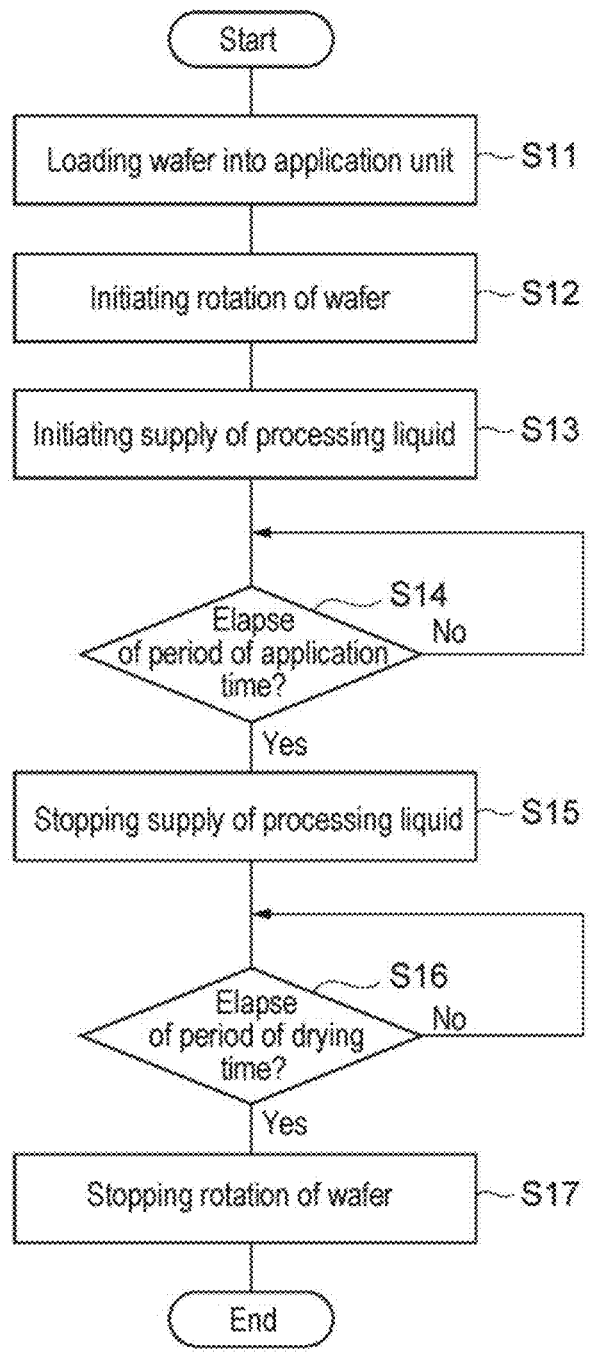
FIG. 7 is a flowchart showing a liquid-film forming procedure.

As shown in FIG. 7, step S01 sequentially includes, for example, steps S11 to S17. In step S11, the application control part 111 controls the delivery arm A1 and the transfer arm A2 so as to load the wafer W into the application unit 30. For example, the application control part 111 controls the delivery arm A1 so as to take out the wafer W from the carrier 10 and place it on the shelf part 23 and also controls the transfer arm A2 so as to load the wafer W placed on the shelf part 23 into the application unit 30. Then, the application control part 111 controls the rotating/holding mechanism 31 of the application unit 30 such that the wafer W transferred by the transfer arm A2 is held by the holding part 33.

In step S12, the application control part 111 controls the application unit 30 so as to initiate rotation of the wafer W and the holding part 33 by the driving part 34.

In step S13, the application control part 111 controls the processing-liquid supplying part 32 so as to initiate supply of the first processing liquid onto the surface Wa of the wafer W which is being rotated. For example, the application control part 111 controls the processing liquid supplying part 32 so as to supply the first processing liquid from the main body 35 to the nozzle 36 and to downwardly discharge the first processing liquid from the nozzle 36 in a state where the nozzle 36 is disposed above a center of rotation of the wafer W. The first processing liquid that reaches the surface Wa is spread out toward an outer periphery of the wafer W by a centrifugal force of the rotation of the wafer W. Accordingly, the first processing liquid is applied to the surface Wa so that a liquid film LF1 is formed on the surface Wa. (see FIGS. 7 and 8)

In step S14, the application control part 111 waits for an elapse of a predetermined period of application time. For example, the period of application time is set by presenting a condition in advance.

In step S15, the application control part 111 controls the processing-liquid supplying part 32 so as to stop the supply of the first processing liquid.

In step S16, the application control part 111 waits for an elapse of a predetermined period of drying time. For example, the period of drying time is set by presenting a condition in advance.

In step S17, the application control part 111 controls the application unit 30 so as to stop the rotation of the wafer W and the holding part 33 caused by the driving part 34. In such a manner, step S01 is completed.

Figure 8:
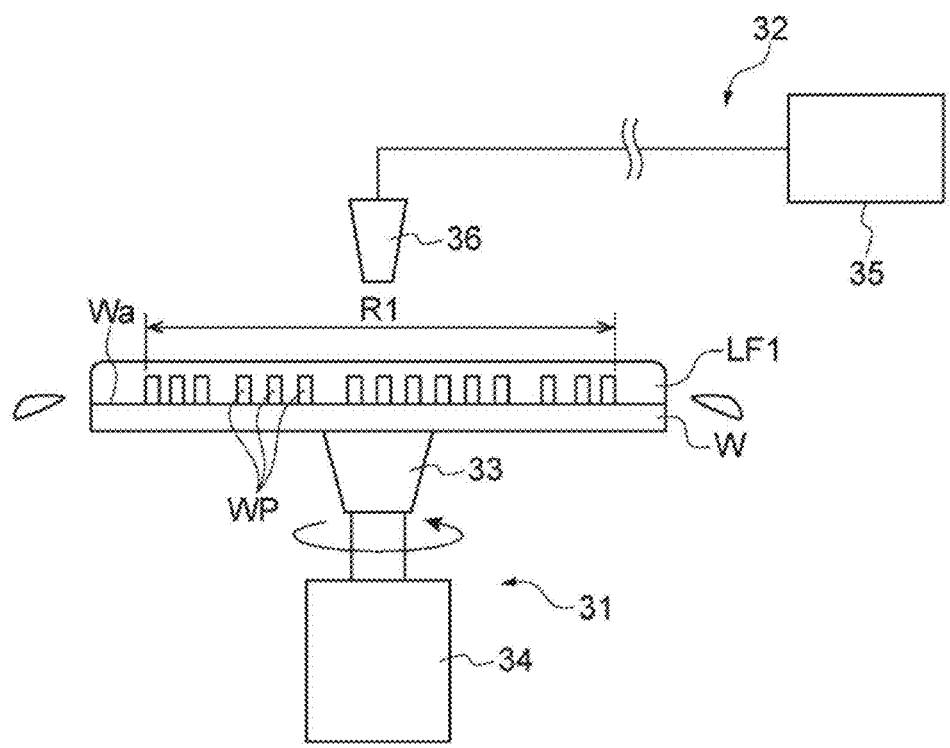
FIG. 8 is a schematic diagram illustrating a state of a wafer in the liquid-film forming procedure.

As shown in FIG. 8, the wafer W that is a target object in step S01 may have an uneven pattern WP formed on the surface Wa. In this case, the application of the processing liquid to the surface Wa includes applying the processing liquid to an uneven portion R1 in the surface Wa.

Figure 9:
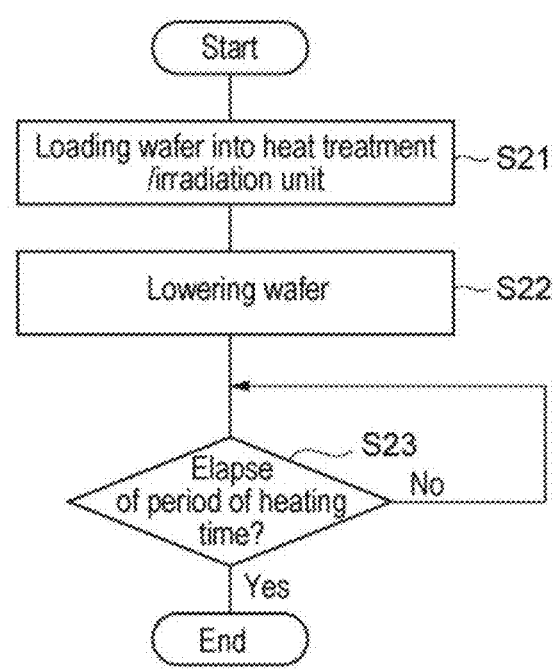
FIG. 9 is a flowchart showing a liquid-film heating procedure.

As shown in FIG. 9, step S02 sequentially includes, for example, steps S21 to S23. In step S21, the heat treatment control part 112 controls the transfer arm A2 so as to unload the wafer W from the application unit 30 and to load it into the heat treatment/irradiation unit 40. Before the transfer arm A2 unloads the wafer W from the application unit 30, the heat treatment control part 112 controls the rotating/holding mechanism 31 so as to release the holding state of the wafer W caused by the holding part 33. Before the transfer arm A2 loads the wafer W into the heat treatment/irradiation unit 40, the heat treatment control part 112 controls the lifting mechanism 44 so as to cause the lifting pins 45 to be raised by the driving part 46 so that the tips of the lifting pins protrude above the hot plate 43. Then, the heat treatment control part 112 controls the transfer arm A2 so as to place the wafer W, which has been loaded into the heat treatment/irradiation unit 40, on the lifting pins 45 (see FIGS. 9 and 10A).

In step S22, the heat treatment control part 112 controls the lifting mechanism 44 so as to maintain the temperature of the hot plate 43 around the first temperature while controlling the driving part 46 to lower the lifting pins 45 (see FIGS. 9 and 10B). When the wafer W is placed on the hot plate 43 by lowering the lifting pins 45, heat generated in the hot plate 43 is transferred to the wafer W and subsequently to the liquid film LF1. In other words, heating of the liquid film LF1 via the wafer F is initiated.

In step S23, the heat treatment control part 112 waits for an elapse of a predetermined period of heating time while maintaining the temperature of the hot plate 43 around the first temperature. For example, the period of heating time is set by presenting a condition in advance. Since the temperature of the hot plate 43 is maintained around the first temperature, the first liquid film LF1 is continuously heated at the first temperature until the period of heating time elapses. In such a manner, step S02 is completed.

Figure 12A:
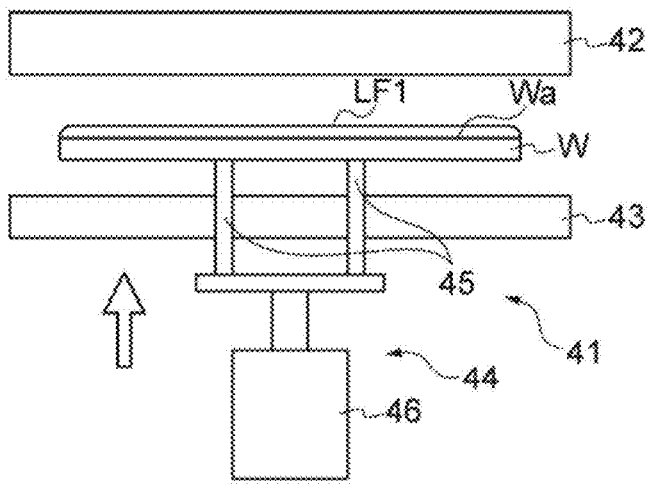
FIGS. 12A to 12C are schematic diagrams illustrating a state of the wafer in the coating-film forming procedure.

As shown in FIG. 11, step S03 sequentially includes, for example, steps S31 to S35. In step S31, the irradiation control part 113 controls the lifting mechanism 44 so as to cause the lifting pins 45 to be raised by the driving part 46. The wafer W is raised upwardly from the hot plate 43 as the lifting pins 45 are raised, so that the wafer W approaches the irradiation part 42 (see FIGS. 11 and 12A).

Figure 12B:
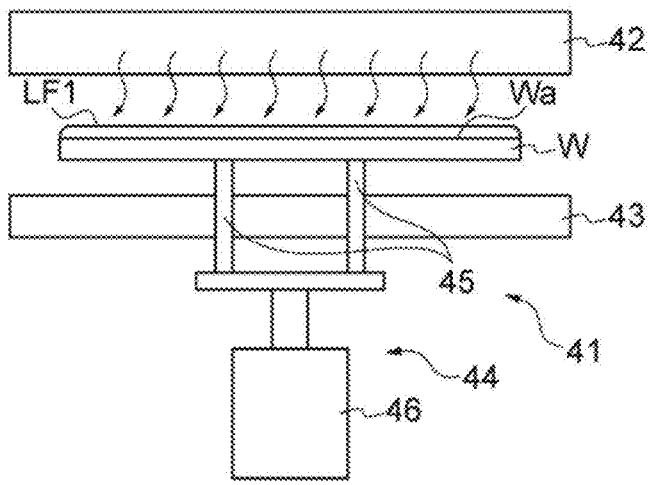

In step S32, the irradiation control part 113 controls the irradiation part 42 so as to initiate the irradiation of the liquid film LF1 with the energy rays (see FIGS. 11 and 12B).

Figure 12C:
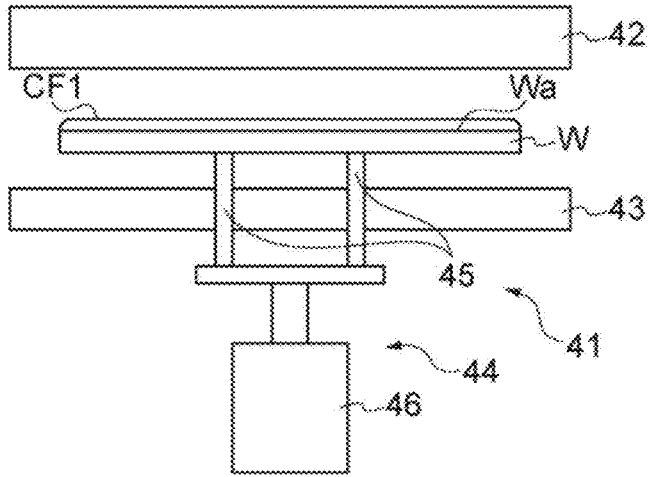

In step S33, the irradiation control part 113 waits for an elapse of a predetermined period of irradiation time. For example, the period of irradiation time is preset by presenting a condition in advance. When the irradiation of the energy rays continues over the period of irradiation time, crosslinking of the first compound contained in the liquid film LF1 is facilitated. Specifically, a protective group of the first compound is removed by the irradiation of the energy rays, and a crosslinking reaction occurs in the first compound. In such a manner, the coating film CF1 containing the metal oxide is formed on the surface Wa (see FIG. 11 and FIG. 12C).

In step S34, the irradiation control part 113 controls the irradiation part 42 so as to stop the irradiation of the energy rays.

In step S35, the irradiation control part 113 controls the delivery arm A1 and the transfer arm A2 so as to unload the wafer W from the heat treatment/irradiation unit 40 and to return it into the carrier 10. For example, the irradiation control part 113 controls the transfer arm A2 so as to unload the wafer W from the heat treatment/irradiation unit 40 and then place it on the shelf part 23, and controls the delivery arm A1 so as to return the wafer W placed on the shelf part 23 into the carrier 10. In such a manner, step S03 is completed.

The substrate processing procedure may further include applying the second processing liquid to the surface Wa to form an underlying liquid film having a thickness less than that of the liquid film LF1 on the surface Wa before forming the liquid film LF1 on the surface Wa, and heating the underlying liquid film at the second temperature to form an underlying coating film having a thickness less than that of the coating film CF1 on the surface Wa. For example, as shown in FIG. 13, the substrate processing procedure may include steps 41 to S45.

Figure 13:
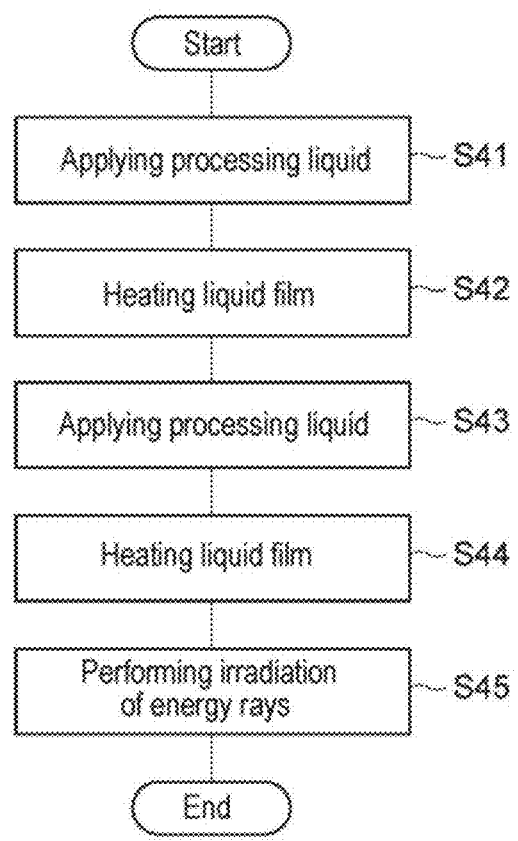
FIG. 13 is a flowchart showing a modified example of the substrate processing procedure.
Figure 14A:
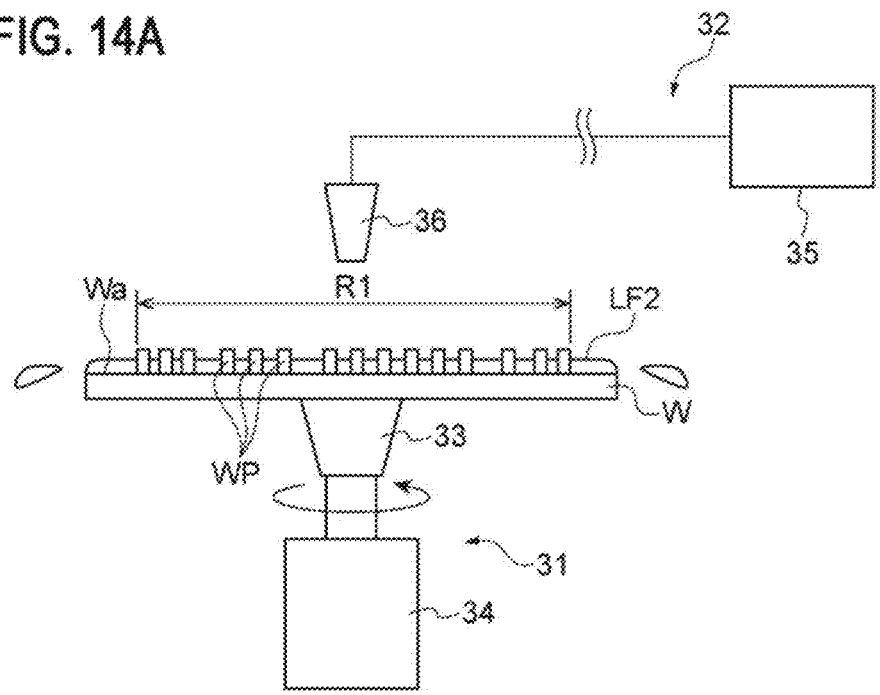
FIGS. 14A to 14C are schematic diagrams illustrating a state of the wafer in the wafer processing procedure of FIG. 13.

In step S41, the controller 100 controls the application unit 30 to apply the second processing liquid on the surface Wa so as to form an underlying liquid film LF2 having a thickness less than that of the liquid film LF1 on the surface Wa (see FIGS. 13 and 14A).

Figure 14B:
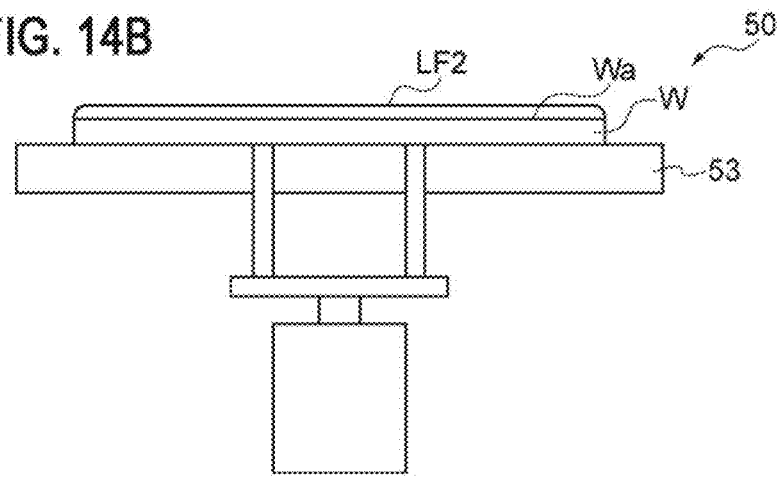

In step S42, the controller 100 controls the heat treatment unit 50 to heat the underlying liquid film LF2 at the second temperature so as to form an underlying coating film CF2 having a thickness less than that of the coating film CF1 on the surface Wa (see FIGS. 13 and 14B).

Figure 14C:
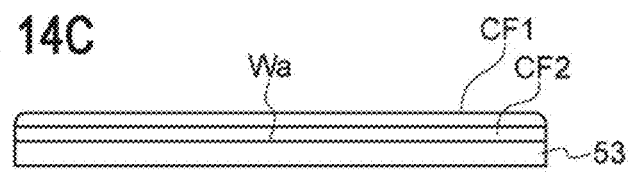

Steps S43 to S45 are the same as steps S01 to S03 except that the aforementioned transfer of the water W into the application unit 30 is performed from the heat treatment unit 50 rather than the carrier 10 in step S43. By performing steps S43 to S45, the coating film CF1 is formed on the underlying coating film CF2 (see FIGS. 13 and 14C).

Hereinafter, processing in steps S41 and S42 will be described in greater detail. As shown in FIG. 15, step S41 sequentially includes, for example, steps S51 to S57. Although the operations performed in steps S51 to S57 are the same as those in steps S11 to S17, a setting condition in either of the steps is different such that the underlying liquid film LF2 is formed to have a thickness less than that of the liquid film LF1. In steps S52 to S55, for example, the application control part 111 may control the rotating/holding mechanism 31 to rotate the wafer W at a rotational speed which is higher than that in steps S12 to S15. In steps S53 to S55, the application control part 111 may control the processing-liquid supplying part 32 so as to supply the second processing liquid to the surface Wa, wherein the second processing liquid has a concentration of the first compound lower than that in the first processing liquid. The period of application time in step S54 may be set to be shorter than that in step S14, and the period of drying time in step S56 may be set to be longer than that in step S16.

Figure 16:
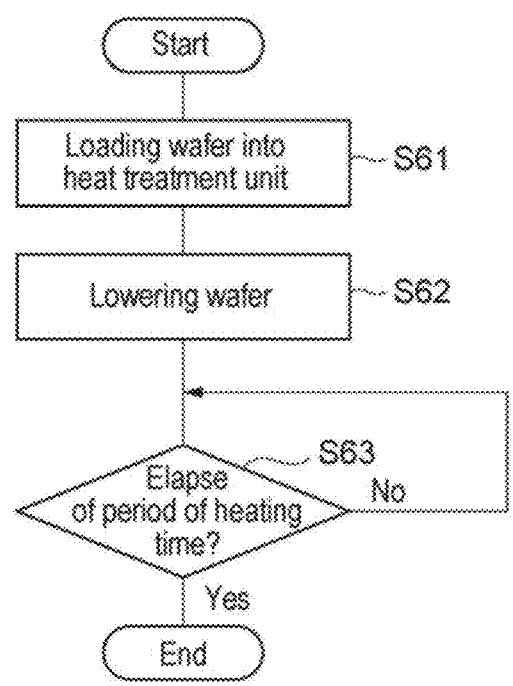
FIG. 16 is a flowchart showing an underlying coating-film forming procedure.

As shown in FIG. 16, step S42 sequentially includes, for example, steps S61 to S63. In step S61, the heat treatment control part 112 controls the transfer arm A2 so as to unload the wafer W from the application unit 30 and load it into the heat treatment unit 50. Before the transfer arm A2 unloads the wafer W from the application unit 30, the heat treatment control part 112 controls the rotating/holding mechanism 31 so as to release the holing state of the wafer W caused by the holding part 33.

In step S62, the heat treatment control part 112 controls the heat treatment unit 50 so as to heat the underlying liquid film LF2 at the second temperature. For example, by placing the wafer W on the hot plate 53 in a state where the temperature of the hot plate 53 of the heat treatment unit 50 is maintained around the second temperature, the heat treatment control part 11 controls the liquid film LF2 to be heated (see FIG. 14C).

In step S63, the heat treatment control part 112 waits for an elapse of a predetermined period of heating time while maintaining the temperature of the hot plate around the second temperature. For example, the period of heating time is set by presenting a condition in advance. When the underlying liquid film LF2 is continuously heated over the period of heating time, volatilization of the solvent contained in the underlying liquid film LF2 and the crosslinking of the first compound are facilitated. Specifically, the protective group of the first compound is removed by heating, and the crosslinking reaction occurs in the first compound. The underlying coating film CF2 is thereby formed on the surface Wa. In such a manner, step S42 is completed.

In addition, prior to steps S43 to S45, steps S41 and S42 may be repeated multiple times.

Effects of Present Embodiment

As described above, the substrate processing method according to the present embodiment includes applying the solution of the compound containing a metal oxide to the surface Wa so as to form the liquid film LF1 of the corresponding solution on the surface Wa of the wafer W, heating the liquid film LF1 at the first temperature lower than the crosslinking temperature of the corresponding compound, and irradiating the liquid film LF1 with the energy rays to form the coating film CF1 containing the metal oxide on the surface Wa after heating the liquid film LF1 at the first temperature.

According to this substrate processing method, the liquid film LF1 is heated at the first temperature lower than the crosslinking temperature, so that the volatilization of the solvent is facilitated in a state where fluidity of the compound is maintained. By maintaining the fluidity of the compound, generation of bubbles is suppressed during the volatilization of the solvent. Then, the crosslinking reaction of the compound in the liquid film LF1 is facilitated by the irradiation of the energy rays to form the coating film CF1 containing the metal oxide. With the irradiation of the energy rays, contraction of the liquid film LF1 involved in the crosslinking reaction tends to be further suppressed, as compared with heating. Further, since the volatilization of the solvent is facilitated before the irradiation of the energy rays, the contraction of the liquid film LF1 involved in the progress of the crosslinking reaction is further suppressed. Therefore, since the generation of bubbles involved in the contraction of the liquid film LF1 is suppressed, it is possible to suppress the generation of bubbles when the coating film CF1 is formed.

FIGS. 17A to 17F are electron microscope photographs of cross sections of the wafer W after forming the coating film CF1. FIGS. 17A and 17B are photographs of the wafer W in which the crosslinking reaction in the compound of the liquid film LF1 is facilitated by means of heating in place of the irradiation of the energy rays (hereinafter, this wafer is referred to as "first sample"). FIGS. 17C and 17D are photographs of the wafer W in which the crosslinking reaction in the compound of the liquid film LF1 is facilitated by means of the irradiation of the energy rays without heating the liquid film LF1 at the first temperature (hereinafter, this wafer is referred to as "second sample"). FIGS. 17E and 17F are photographs of the wafer W in which the crosslinking reaction in the compound of the liquid film LF1 is facilitated by means of the irradiation of the enemy rays after heating the liquid film LF1 at the first temperature (hereinafter, this wafer is referred to as "third sample").

In the first sample, as shown in FIGS. 17A and 17B, a bubble V is generated in either of a relatively wide concave portion H1 and a relatively narrow concave portion H2. In the second sample, as shown in FIGS. 17C and 17D, a bubble V is not substantially generated in the concave portion H1 but is generated in the concave portion H2. In the third sample, as shown in FIGS. 17E and 17F, a bubble V is not substantially generated in the concave portion H1 and the bubbles V are also considerably reduced in the concave portions H2. As such, by heating the liquid film LF1 at the first temperature and forming the coating film CF1 using the irradiation of the energy rays, it is possible to remarkably suppress the generation of bubbles.

The solution may contain a solvent, and the first temperature may be equal to or less than a boiling point of the solvent. In this case, by causing the volatilization of the solvent to gently proceed, the generation of bubbles can be suppressed more securely.

The method of the present disclosure may further include applying the solution of the compound to the surface Wa to form the underlying liquid film LF2, which has a thickness less than that of the liquid film LF1, on the surface Wa before forming the liquid film LF1 on the surface Wa, and heating the underlying liquid film LF2 at the second temperature higher than the crosslinking temperature of the compound to form the underlying coating film CF2, which has a thickness less than that of the coating film CF1, on the surface Wa. In this case, since the thickness of the underlying liquid film LF2 is smaller than that of the liquid film LF1 and the thickness of the underlying coating film CF2 is smaller than that of the coating film CF1, contraction of the underlying liquid film LF2 is suppressed during forming the underlying coating film CF2. For this reason, a bubble is hardly generated in the course of forming the underlying coating film CF2. By forming the underlying coating film CF2 before forming the liquid film LF1, separation of the liquid film LF1 from the surface Wa is suppressed when the liquid film LF1 is contracted. For this reason, the generation of bubbles in the course of forming the coating film CF1 is further suppressed. Therefore, it is possible to more securely suppress the generation of bubbles.

The application of the solution to the surface Wa may include applying the solution to an uneven region in the surface Wa. If the surface Wa has an unevenness, bubbles involved in the contraction of the liquid film LF1 tend to be easily generated, particularly in concave portions. For this reason, when the coating film CF1 is formed on the surface Wa having the unevenness, the effects caused by the suppression of the contraction of the liquid film LF1 becomes more remarkable.

Although the present disclosure has been described above in connection with the embodiments, it is not necessarily limited to the aforementioned embodiments and various modifications may be made without departing from the subject matter of the disclosure. For example, the substrate processing procedure performed by the substrate processing system 1 may further include heating the coating film CF1 at a temperature higher than the crosslinking temperature after forming the coating film CF1. The substrate as a target object is not limited to a semiconductor wafer, but may be a glass substrate, a mask substrate and an FPD (flat panel display). The coating film to which the present disclosure is applied is not limited to the aforementioned mask. For example, a gate insulation film of a MOSFET (metal oxide semiconductor field effect transistor) may also be an object to which the present disclosure is applied.

According to the present disclosure, it is possible to suppress generation of bubbles upon formation of a coating film containing a metal oxide.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method, comprising:
    applying a solution of a compound containing a metal oxide to a surface of a wafer to form a liquid film of the solution on the surface of the wafer;
    heating the liquid film at a first temperature lower than a crosslinking temperature of the compound; and
    irradiating the liquid film with energy rays to form a coating film containing the metal oxide on the surface, after heating the liquid film at the first temperature,
    wherein, before the applying a solution, the method comprises,
    applying an initial solution of a compound to form an underlying liquid film on the surface, the underlying liquid film having a thickness less than that of the liquid film; and
    heating the underlying liquid film at a second temperature higher than a crosslinking temperature of the initial solution of the compound to form an underlying coating film on the surface, the underlying coating film having a thickness less than a thickness of the coating film, and
    wherein the initial solution of the compound and the solution of the compound are the same.

2. The method of claim 1, wherein the solution comprises a solvent, and the first temperature is equal to or less than a boiling point of the solvent.

3. The method of claim 1, wherein the metal oxide comprises at least one of titanium oxide, zirconium oxide, tantalum oxide, tungsten oxide, hafnium oxide and aluminum oxide.

4. The method of claim 1, wherein the applying a solution comprises applying the solution to an uneven region in the surface.

5. The method of claim 1, wherein a mask for protecting the surface of the wafer is formed as the coating film.

6. A substrate processing apparatus, comprising:
    a first processing part configured to apply a solution of a compound containing a metal oxide;
    a second processing part configured to perform a heat treatment at a first temperature;
    a third processing part configured to perform an irradiation of energy rays;
    a fourth processing part configured to perform a heat treatment at a second temperature; and
    a controller,
    wherein the controller is configured to perform:
    a control operation for controlling the first processing unit to apply the solution to a surface of a wafer so as to form a liquid film of the solution on the surface of the wafer,
    a control operation for controlling the second processing part to heat the liquid film at the first temperature lower than a crosslinking temperature of the compound, and
    a control operation for controlling the third processing part to irradiate the liquid film with the energy rays so as to form a coating film containing the metal oxide on the surface of the wafer, after heating the liquid film at the first temperature,
    wherein, before the control operation for controlling the first processing unit, the controller is configured to perform:
    a pre-control operation for controlling the first processing part to apply an initial solution of a compound to form an underlying liquid film on the surface, the underlying liquid film having a thickness less than that of the liquid film; and
    a pre-control operation for controlling the fourth processing part to heat the underlying liquid film at the second temperature higher than a crosslinking temperature of the initial solution of the compound to form an underlying coating film on the surface, the underlying coating film having a thickness less than a thickness of the coating film, and
    wherein the initial solution of the compound and the solution of the compound are the same.

7. A non-transitory computer-readable recording medium having a program recorded therein, the program executing the substrate processing method according to claim 1 in an apparatus.

* * * * *